(12) United States Patent
Berger et al.

(10) Patent No.: US 9,252,045 B2
(45) Date of Patent: *Feb. 2, 2016

(54) METHOD FOR MANUFACTURING A COMPOSITE WAFER HAVING A GRAPHITE CORE

(71) Applicant: Infineon Technologies AG, Neubiberg (DE)

(72) Inventors: Rudolf Berger, Regensburg (DE); Hermann Gruber, Woerth a. D. (DE); Wolfgang Lehnert, Lintach (DE); Guenther Ruhl, Regensburg (DE); Raimund Foerg, Straubing (DE); Anton Mauder, Kolbermoor (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/776,796

(22) Filed: Feb. 26, 2013

(65) Prior Publication Data
US 2014/0070232 A1  Mar. 13, 2014

Related U.S. Application Data

(62) Division of application No. 12/894,344, filed on Sep. 30, 2010, now Pat. No. 8,404,562.

(51) Int. Cl.
*H01L 21/30* (2006.01)
*H01L 21/46* (2006.01)
(Continued)

(52) U.S. Cl.
CPC .... *H01L 21/76251* (2013.01); *H01L 21/02002* (2013.01); *H01L 21/7624* (2013.01); *H01L 29/02* (2013.01); *H01L 29/16* (2013.01); *H01L 29/1608* (2013.01); *H01L 21/0237* (2013.01); *H01L 21/0243* (2013.01);
(Continued)

(58) Field of Classification Search
CPC .............. H01L 21/02002; H01L 21/0237; H01L 21/02527; H01L 21/76251; H01L 21/02115
USPC .......... 438/458, 455, 456, 459, 464, 474, 475, 438/795, 478, 105, 758; 257/E21.211
See application file for complete search history.

(56) References Cited

U.S. PATENT DOCUMENTS 4,534,951 A * 8/1985 Kortovich et al. ............ 423/448
5,374,329 A * 12/1994 Miyawaki .................... 438/459
(Continued)

FOREIGN PATENT DOCUMENTS

CN  1894795 A   1/2007
CN  101295758 A  10/2008
(Continued)

OTHER PUBLICATIONS

Klose, et al., "Terminologie zur Beschreibung von Kohlenstoff als Feststoff", 2009.

*Primary Examiner* — Shouxiang Hu
(74) *Attorney, Agent, or Firm* — Murphy, Bilak & Homiller, PLLC

(57) ABSTRACT

A composite wafer including a carrier substrate having a graphite core and a monocrystalline semiconductor substrate or layer attached to the carrier substrate and a corresponding method for manufacturing such a composite wafer is provided.

3 Claims, 7 Drawing Sheets

(51) Int. Cl.
*H01L 21/31* (2006.01)
*H01L 21/469* (2006.01)
*H01L 21/762* (2006.01)
*H01L 29/02* (2006.01)
*H01L 29/16* (2006.01)
*H01L 21/02* (2006.01)

(52) U.S. Cl.
CPC .... *H01L 21/02527* (2013.01); *H01L 21/02601* (2013.01); *H01L 21/02628* (2013.01)

(56) References Cited

U.S. PATENT DOCUMENTS

| | | |
|---|---|---|
| 5,603,779 A | 2/1997 | Linn et al. |
| 5,744,852 A | 4/1998 | Linn et al. |
| 5,770,468 A | 6/1998 | Kosaki |
| 6,596,610 B1 | 7/2003 | Kuwabara et al. |
| 7,344,936 B2 | 3/2008 | Schulze et al. |
| 7,491,342 B2 | 2/2009 | Kamiyama et al. |
| 7,741,632 B2 | 6/2010 | Xiong et al. |
| 7,759,163 B2 | 7/2010 | Kroeninger et al. |
| 8,822,306 B2 * | 9/2014 | Berger et al. ............... 438/455 |
| 2006/0040469 A1 * | 2/2006 | Aga et al. .................. 438/458 |
| 2006/0118935 A1 * | 6/2006 | Kamiyama et al. .......... 257/684 |
| 2008/0001274 A1 * | 1/2008 | Deleonibus ................. 257/684 |
| 2008/0265265 A1 * | 10/2008 | Xiong et al. ................. 257/97 |

FOREIGN PATENT DOCUMENTS

| | | |
|---|---|---|
| DE | 10043587 A1 | 7/2001 |
| DE | 10318283 A1 | 11/2004 |
| DE | 102005030466 A1 | 1/2007 |

\* cited by examiner

METHOD FOR MANUFACTURING A COMPOSITE WAFER HAVING A GRAPHITE CORE

PRIORITY CLAIM

This application is a Divisional of U.S. application Ser. No. 12/894,344, filed on 30 Sep. 2010, the content of said application incorporated herein by reference in its entirety.

FIELD OF THE INVENTION

Embodiments described herein relate to composite wafers having a graphite core, and embodiments of methods for manufacturing composite wafers having a graphite carrier. Some embodiments relate to composite wafers having a graphite core and a monocrystalline semiconductor layer. Further embodiments pertain to methods for manufacturing a plurality of semiconductor devices.

BACKGROUND

Semiconductor wafers such as silicon wafers having different thicknesses, which are sufficiently mechanically stable for handling, are used for manufacturing of semiconductor devices and integrated circuits. In most cases, comparably thick wafers are needed mainly for mechanical reasons during manufacturing but not for the final devices.

For many applications, for example electronic components such as fast-switching CMOS circuits, parasitic electrical coupling of the individual devices of the circuit to the large semiconductor volume of the wafer may result in unwanted coupling between individual devices and can limit the switching speed. Therefore, silicon-on-insulator (SOI) wafers are often employed. Such wafers include a buried oxide layer which electrically insulates the silicon layer used for forming the devices from the remaining semiconductor substrate. However, SOI-wafers are comparably expensive.

On the other hand, thin monocrystalline semiconductor wafers are desired for many applications such as devices for chip cards or devices where the current path goes from the top surface to the bottom surface. For such thin wafers additional carriers are needed for mechanical reason during processing. Although the additional carriers improve the mechanical stability, additional costs incur. Furthermore, the carriers often tolerate only moderate processing conditions to which the semiconductor wafers are subjected and therefore limit their application.

For example carriers such a glass carriers glued to semiconductor wafers are often limited to temperatures below 350° C. due to the limited thermal stability of the adhesive. Glass carriers are also prone to breaking so that care must be taken during low pressure and vacuum processes. On the other hand, expensive SOI carrier system can withstand high temperatures but their manufacturing, particularly the bonding processes of partially or completely processed wafers are technologically difficult.

SUMMARY

According to one or more embodiments, a method for manufacturing a composite wafer is provided. The method includes providing a monocrystalline semiconductor wafer having a first side and a second side arranged opposite the first side; depositing a moulding composition including at least one of carbon powder and pitch on the second side of the semiconductor wafer; and annealing the deposited moulding composition to form a graphite carrier attached to the semiconductor wafer. According to an embodiment, the moulding composition includes, in addition to or alternative, hydrocarbons such as aromatic hydrocarbons forming a past-like or flowable polymer composition.

According to one or more embodiments, a method for manufacturing a composite wafer is provided. The method includes providing a carrier wafer having a graphite core and a protective structure encapsulating the graphite core; and bonding a monocrystalline semiconductor substrate to the carrier wafer. According to one or more embodiments, the protective structure includes a barrier material which has oxygen-diffusion and/or hydrogen-diffusion barrier properties sufficient to prevent oxygen and/or hydrogen diffusion during processing in oxygen containing atmospheres. The protective structure can e.g. be a silicon layer. In this case the bonding process can be replaced by a local etching of the silicon substrate on the wafer backside.

According to one or more embodiments, a method for manufacturing a composite wafer is provided. The method includes providing a monocrystalline semiconductor wafer having a first side and a second side arranged opposite to the first side; implanting gas ions (e.g. protons) into the second side of the monocrystalline semiconductor wafer to form a delamination layer at a predefined depth in the monocrystalline semiconductor wafer; depositing a moulding composition including at least one of carbon powder and pitch on the second side of the monocrystalline semiconductor substrate at relatively low temperatures (e.g. T<400° C. or better <100° C.); and subjecting the monocrystalline semiconductor wafer and the moulding composition to at least one heat treatment to form a graphite carrier attached to the second side of the semiconductor wafer and split the monocrystalline semiconductor wafer along the delamination layer. According to one or more embodiments, the delamination layer can be formed by a micro-bubble layer or micro-porous layer. Optionally, an epitaxial layer of the semiconductor material with a well-defined thickness can be deposited on the surface of the monocrystalline semiconductor material.

According to one or more embodiments, a method for manufacturing a plurality of semiconductor devices is provided. The method includes providing a composite wafer having a graphite carrier and a monocrystalline semiconductor layer attached to the graphite carrier; processing the monocrystalline semiconductor layer to form a plurality of semiconductor devices; and dicing the processed monocrystalline semiconductor layer to form a plurality of separated semiconductor devices.

According to an embodiment, further includes removing the graphite carrier from the processed monocrystalline semiconductor layer before dicing.

According to an embodiment, further includes removing the graphite carrier from the processed monocrystalline semiconductor layer after dicing.

According to an embodiment, providing a composite wafer includes providing a monocrystalline semiconductor substrate having a first side and a second side arranged opposite to the first side; depositing a moulding composition having at least one of carbon powder and pitch on the second side of the semiconductor substrate; and annealing the deposited moulding composition to form a graphite carrier attached to the semiconductor substrate.

According to one or more embodiments, a composite wafer is provided. The composite wafer includes a carrier substrate having a graphite core, and a monocrystalline semiconductor substrate or layer selected from silicon carbide and silicon attached to the carrier substrate.

According to one or more embodiments, a composite wafer is provided. The composite wafer includes a carrier substrate having a graphite core and a protective structure encapsulating the graphite core, and a monocrystalline semiconductor layer or substrate attached to the carrier substrate.

According to one or more embodiments, the carrier substrate includes turbostratic or amorphous graphite. According to one or more embodiments, the carrier substrate further includes a semiconductor rim or edge structure laterally surrounding the graphite core. Rim structure (edge structure) can be a part of the protective structure. According to one or more embodiments, the carrier substrate further includes a semiconductor wafer having a recess, wherein the graphite core is disposed in the recess.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1A:
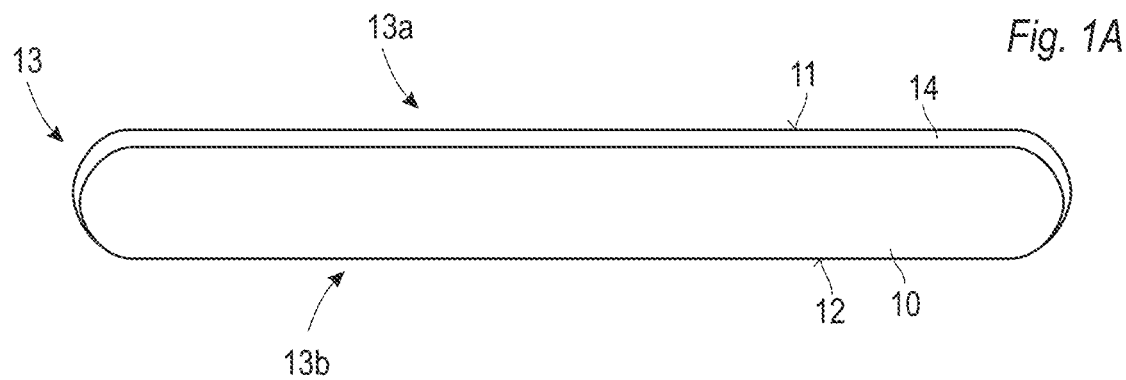
FIGS. 1A to 1J illustrate processes of a method for manufacturing a composite wafer according to an embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

When referring to semiconductor devices, at least two-terminal devices are meant, an example is a diode. Semiconductor devices can also be three-terminal devices such as a field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. Integrated circuits include a plurality of integrated devices.

Specific embodiments described herein pertain to, without being limited thereto, composite wafers having a graphite core and particularly to composite wafers having a graphite core comprised of turbostratic or amorphous graphite.

With reference to FIGS. 1A to 1J, a first embodiment of a method for manufacturing a composite wafer 13 is described. Briefly, a monocrystalline semiconductor wafer 10 having a first side or first surface 11 and a second side or second surface 12 arranged opposite to the first side 11 is provided. Composite wafer 13 also includes a first side 13a and a second side 13b. First side 13a is orientated in the Figures to the top while second side 13b is orientated to the bottom. The terms first side 13a and second side 13b of composite wafer 13 does not necessarily mean a specific surface of a given layer unless otherwise stated but generally describe the respective sides of the composite wafer 13 irrespective of the actual material or layer disposed on one of the sides.

The semiconductor wafer 10 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

In one of the subsequent processes, a moulding composition 35 including at least one of carbon powder and pitch is deposited on the second side 13b of the composite wafer 13, which can be formed by second side 12 of semiconductor wafer 10, by any suitable process such as, for example, injection moulding, compression moulding, powder moulding or pressing using a die to bring a quantity of the moulding composition 35 under a given pressure onto the second side 12 of the semiconductor substrate 10, or any other process capable of covering the second side with a paste-like or viscous layer. Second side 13b of the composite 13 can be formed by the exposed semiconductor material of semiconductor wafer 10 or can include one or more layers covering the semiconductor material. In one of the subsequent processes, the moulding composition 35 is annealed to form a graphite carrier or core 36 attached to the semiconductor wafer 10.

Annealing can include, according to an embodiment, annealing in a first temperature range and subsequently in a second temperature range which is different to the first temperature range. Second temperature range can encompass temperatures higher than the first temperature range. For example, first temperature range can be from about room temperature to about 600° C. Second temperature range can be, for example, from about 500° C. to about 1000° C. or even higher. The first annealing process can be used for removing additives and auxiliary components, such as binders, from the moulding composition. The auxiliary components or additives are thermally driven out off the moulding composition or are thermally decomposed to form volatile compounds. The second annealing process can be used to convert the moulding composition into a graphite material.

According to an embodiment, three annealing processes performed at different temperatures can be used. According to an embodiment, the annealing processes can be combined into a single process having a given temperature profile.

The one or more annealing processes are suitably selected and configured to form a graphite core which is mainly comprised of turbostratic or amorphous graphite. Such graphite improves the mechanical stability of the semiconductor wafer. Furthermore, graphite has a thermal expansion coefficient similar to that of SiC which makes graphite a most promising carrier material for SiC. Graphite, however, is also suitable for other semiconductor materials such as silicon.

The final composite wafer 13 includes a carrier substrate or wafer and a device layer attached thereto. The carrier substrate is formed at least by the graphite core 36 and, according to an embodiment, by the monocrystalline rim or edge structure 15 (in the following rim structure) while the device layer is formed by monocrystalline semiconductor layer 20. The carrier substrate can also include further layers such as a buried insulating layer and at least one protective layer for protecting the graphite core.

According to an embodiment, the semiconductor wafer 10 can be a CZ-wafer manufactured by a Czochralski process or a FZ-wafer manufactured by a float-zone process. For the purpose of illustration only, semiconductor wafer 10 is a Si-wafer in this embodiment. Semiconductor wafer 10 can include a highly p-doped layer 14 formed at its first side or surface 11 as shown in FIG. 1A. P-doped layer 14 forms an etch stop layer in one of the subsequent processes. Highly p-doped layer 14 can be formed, for example, by implantation or by out-diffusion from a BSG (boron silicate glass) layer deposited on the first side 11 of the semiconductor wafer 10. By appropriately selecting the duration and temperature of the out-diffusion step, the layer thickness of the p-doped layer 14 can be adjusted.

Figure 1B:
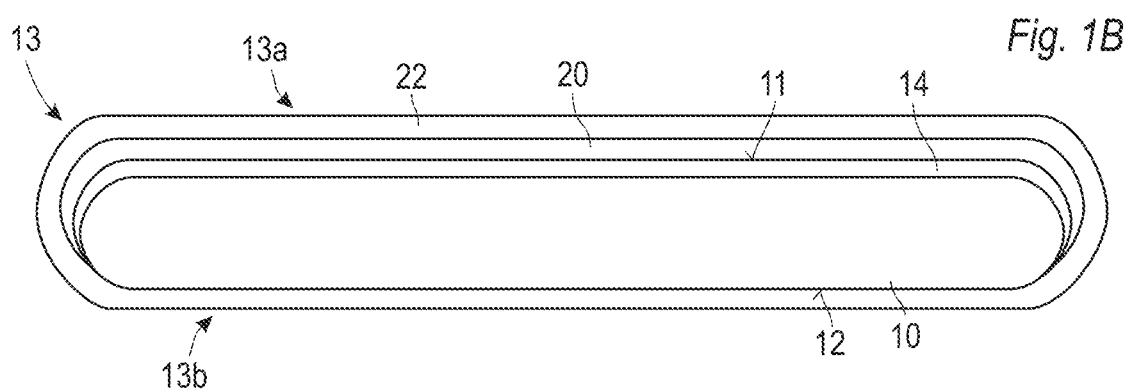

According to an embodiment, a semiconductor layer 20 is epitaxially formed on the first side 11 of the semiconductor wafer 10 as shown in FIG. 1B. If a highly doped layer 14 has been formed in advanced, semiconductor layer 20 is deposited on the highly doped layer 14. Semiconductor layer 14 will later form the device layer, i.e. the substrate in which the semiconductor devices or circuits are integrated. Semiconductor layer 20 can therefore be also referred to as device layer.

Forming an epitaxial semiconductor layer 20 on the semiconductor wafer 10 allows tailoring of the doping concentration to meet specific needs. This also facilitates variation of the doping concentration within semiconductor layer 20.

According to an embodiment, a first protective layer 22 can be provided on the first side 11 of semiconductor wafer 10 or on semiconductor layer 20 if formed as shown in FIG. 1B. First protective layer 22 can be a passivation layer against etching in one of the subsequent processes. For this purpose, any suitable material which allows a selective etching of the material of semiconductor wafer 10 relative to first protective layer 22 can be used. Examples are polysilicon, silicon nitride or silicon oxide. Another example is a CVD graphite layer which can be formed by pyrolysis using volatile hydrocarbons such as alkene (methane, ethan etc.). A further example is a layer of amorphous carbon, so-called diamond-like carbon (DLC), which can be formed from hydrocarbons using PE-CVD (physically enhanced chemical vapour deposition).

First protective layer 22 can also be a foil covering the first side 13a of composite wafer 13, i.e. on the semiconductor layer 20. A foil is a very cost-effective solution and sufficient when first protective layer 22 shall prevent debris or other contaminations from reaching the semiconductor layer 20 during subsequent formation of the graphite carrier or core 36. A foil can also be removed. The resulting structure 13 forming a preliminary stage of the composite wafer 13 is illustrated in FIG. 1B.

Figure 1C:
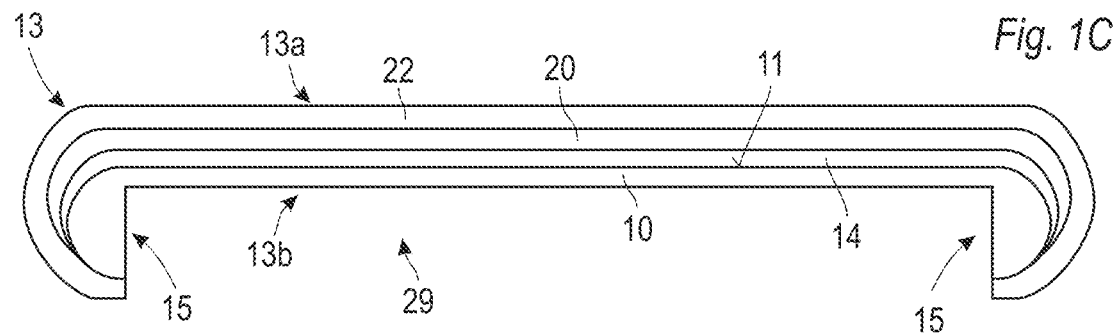

In a further process as illustrated in FIG. 1C, material of the semiconductor wafer 10 is removed at its second side 12 to reduce the thickness of the semiconductor wafer 10 locally. For example, grinding can be used to remove material up to a given thickness. In an embodiment, the grinding stops before the highly doped layer 14 is exposed. In a further process, the semiconductor material is further removed by etching the semiconductor material of the semiconductor wafer 10 selectively to the highly p-doped layer 14. For example, wet-chemical etching using a basic solution can be used. The etching stops when reaching highly p-doped layer 14 so that this layer is exposed at the second side 13b of the composite wafer 13.

According to an embodiment, grinding can be performed such that a rim structure 15 of the semiconductor wafer 10 remains. The rim structure 15 forms a ring of monocrystalline semiconductor material integral with the remaining material of composite wafer 13 and mechanically supports the thinned wafer structure. To form the rim structure 15, grinding is performed only in the central section of the semiconductor wafer 10 to form a recess 29 leaving a small peripheral region ungrinded. Forming a rim structure 15, however, is only optional and not required.

Figure 1D:
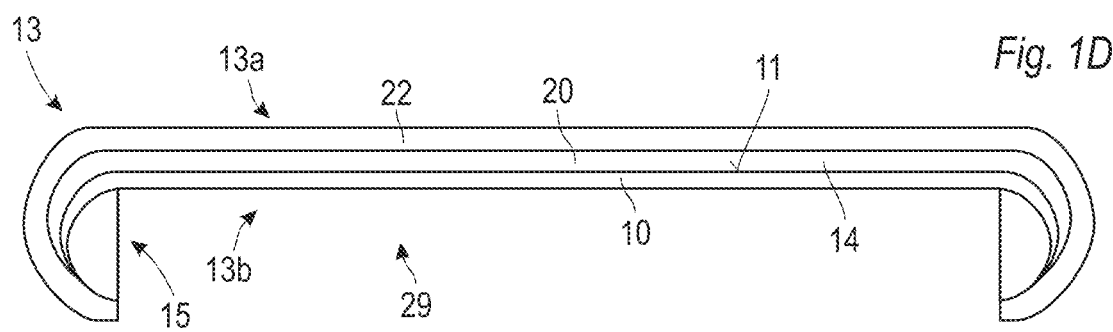

FIG. 1C illustrates the resulting structure of the composite wafer 13 after grinding and FIG. 1D after additional etching. The rim structure 15 or ring 15 has thickness in vertical direction, i.e. in the direction perpendicular to the first and second surfaces 11, 12 of the semiconductor wafer 10, which substantially equals the initial thickness of the semiconductor wafer 10. Typically, the initial thickness of the semiconductor wafer 10 is about few hundred micrometers. The target thickness of the semiconductor wafer 10 after grinding and etching is significantly less than the initial thickness and can be in a range of few ten micrometers depending on the thickness of the finally processed device which has to be chosen so that the desired blocking capability of the device is guaranteed. Since p-doped layer 14 will be removed later in most cases, the actual thickness of the p-doped layer 14 is not important as long as it has a sufficient thickness to serve reliably as an etch stop layer. The final thickness of the device is determined by the thickness of the semiconductor layer 20, which can be 140 µm or less. This thickness is sufficient for many applications including vertical power semiconductor devices having a front-side metallization and a back-side metallization.

Semiconductor wafer 10 is used in the embodiment illustrated in FIGS. 1A to 1J as an "intermediate" carrier for providing a substrate onto which the epitaxial semiconductor layer 20 can be deposited and for building up the composite wafer 13.

Alternatively, if no epitaxial semiconductor layer 20 is formed, the semiconductor wafer 20 can be thinned to a given target thickness so that a thin "membrane" of the semiconductor wafer 20 remains.

Figure 1E:
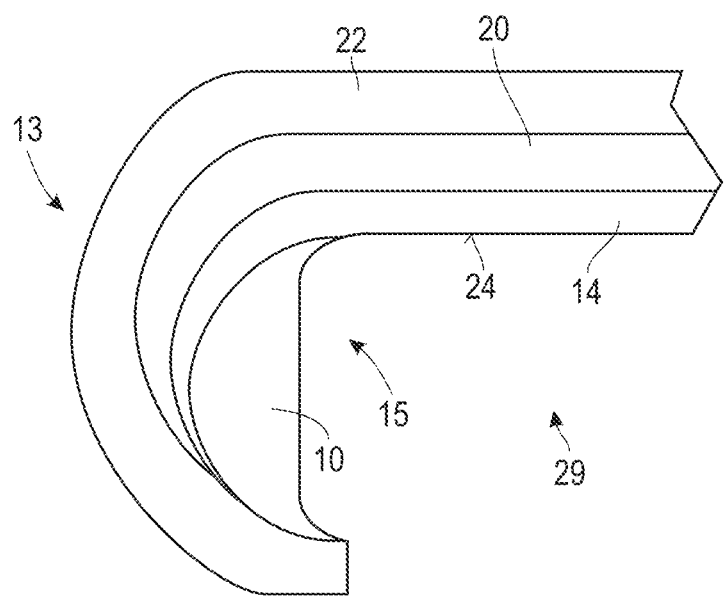

FIG. 1E shows an enlarged section of composite wafer 13 after etching to illustrate the isotropic etch characteristics of the wet-chemical etching. During wet-chemical etching, the ring structure 15 is also partially etched resulting in a partial under-etching as illustrated in FIG. 1E. This is, however, not critical since the total thickness of the semiconductor material to be removed by the wet-chemical etching is rather small, so that a short etching is needed only. Typically, the thickness of the semiconductor material which remains after grinding is in a range of about few µm, for example 10 µm so that isotropic etching will also laterally remove material in a similar range. If desired, the ring structure 15 can be formed thicker to compensate for etch removal.

Figure 1F:
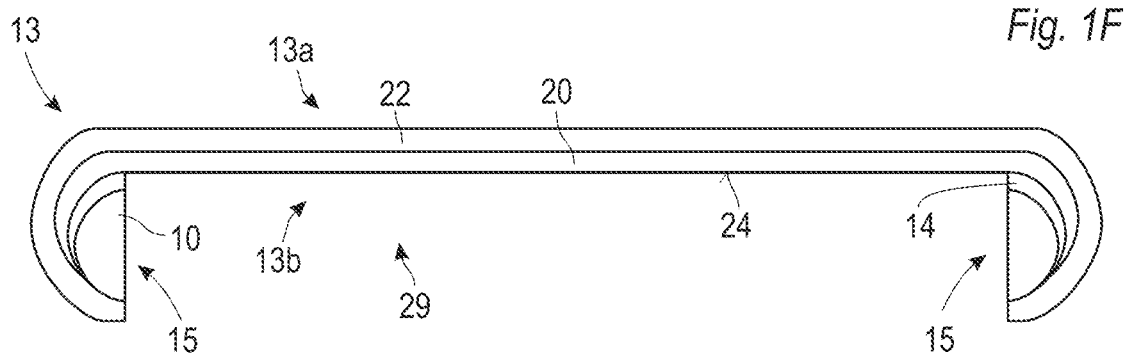

In a further process as illustrated in FIG. 1F, the highly-doped layer 14 exposed in recess 29 is isotropically etched and removed to expose a back-side 24 of the semiconductor layer 20. Isotropic wet-chemical etching can be used to remove the highly-doped layer 14. After this process, back-side implantation processes and/or annealing processes needed for integrating the devices or circuits can be carried out.

P-doped layer 14 has been used above as etch stop layer. Alternative to this process, other processes can be used to define the final or target thickness of the "device layer". For example, a SiGe-layer can be used as etch stop layer onto which the device layer is formed. Another option is the use of a pn-junction as etch stop. For example, if an n-doped device layer is desired, an n-doped semiconductor layer 20 can be epitaxially deposited onto a weekly p-doped semiconductor wafer 10. The pn-junction formed between the n-doped semiconductor layer 20 and the p-doped semiconductor is then reversely biased against the semiconductor wafer 10 or the etch solution and can therefore function as etch stop once the etching has reached the depletion zone of the pn-junction. The remaining p-doped semiconductor material is finally removed by a short isotropic etch process.

Figure 1G:
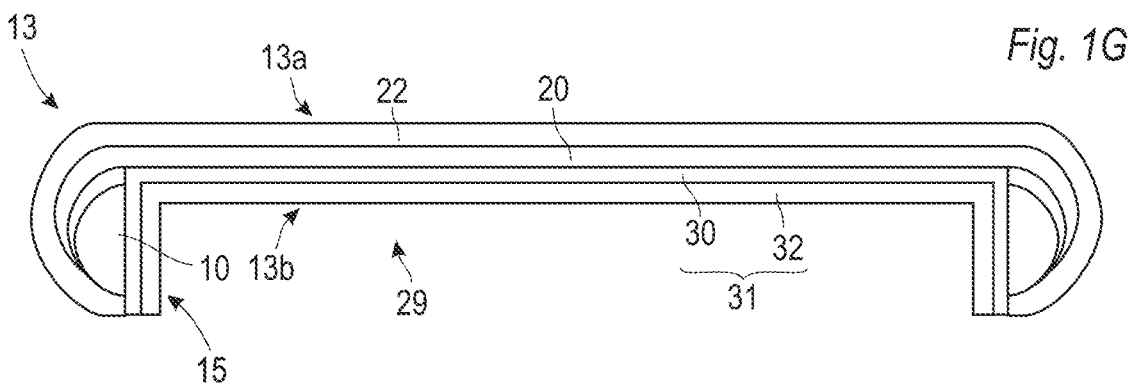

In a further process, an intermediate layer 31 is formed in recess 29 and particularly on the exposed back-side 24 of semiconductor substrate layer 20. Intermediate layer 31 can be a single layer or a layer stack. In the embodiment illustrated here, intermediate layer 31 is formed by an insulating layer 30 and an adhesive layer 32 used to improve adhesion and contact to the subsequently deposited graphite material. Insulating layer 30 can be, for example, a thermal oxide layer 30 or an aluminium nitride layer 30. Alternatively, a conductive layer can be used instead of an insulating layer or insulating layer 30 can even be omitted. Adhesive layer 32 can be, for example, a polysilicon layer. The resulting structure is illustrated in FIG. 1G.

Figure 1H:
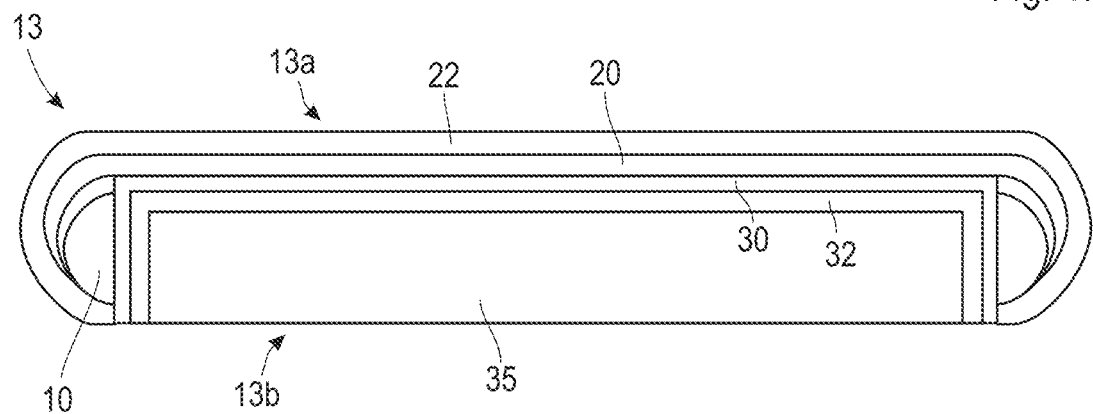

In a further process, as illustrated in FIG. 1H, recess 29 is filled with a moulding composition 35. The moulding composition 35 includes at least one of carbon powder and long-chain hydrocarbons such as pitch. A binder can be added to obtain a plastic or flowable mass. The moulding composition 35 fills recess 29 and is deposited by an injection moulding process for example. Injection moulding is a cost efficient process for forming pieces and can be used here to fill recess 29. Another suitable process is bringing a given quantity of the moulding composition 35 into the recess and then pressing the composition to reliably fill the recess. This process is sometimes referred to as compression moulding.

The consistence of moulding composition 35 is suitably selected to facilitate the filling of recess 29. For example, moulding composition can be a soft composition including mesophase carbon. Mesophase carbon can be described, without being limited to, as a state of pitch in an intermediate state between solid and liquid phase. Pitch can also be in a mesophase state and can include a complex blend or mixture of hydrocarbons such as aromatic hydrocarbons.

After filling recess 29, moulding composition 35 is annealed to form a graphite carrier or core 36 composed of turbostratic or amorphous graphite. Annealing can include a first annealing step for removing the binder or other additives and a second annealing step typically at a higher temperature than the first annealing step for sintering the carbon material such as powder or high-molecular weight hydrocarbons included in the moulding composition. Suitable temperature ranges for the annealing steps have been described above. In an embodiment, a single annealing step with a given temperature profile such as a slowly increasing temperature ramp can also be employed.

If needed, excess graphite material can be subsequently removed by mechanical grinding or any other suitable process. First protective layer 22, which has also been formed on the second side of semiconductor wafer 10 and which still exists on the rim structure 15 can be used as stop layer during grinding.

The thus formed composite wafer 13 has a thickness which exceeds the initial thickness of semiconductor wafer 10 by the thickness of the semiconductor layer 20 and the first protective layer 22. Rim structure 15, which can also be referred to as "reinforcing structure" or "reinforcing ring", laterally protects graphite core 36 and prevents that the lateral edge of graphite core 36 is damaged when handling the composite wafer 13. Since rim structure 15 is composed of monocrystalline semiconductor material of commonly used wafers, no modifications on the handling and processing tools are needed. Furthermore, the composite wafer 13 can be provided with the typical rounded edges used by commonly known wafers. This also facilitates handling of the composite wafer 13.

Formation of the graphite carrier or core 36 as described herein is cost-efficient and a fast procedure. Moreover, virtually any shape of recess 29 can be filled with the moulding composition which also facilitates formation of the graphite carrier.

Figure 1I:
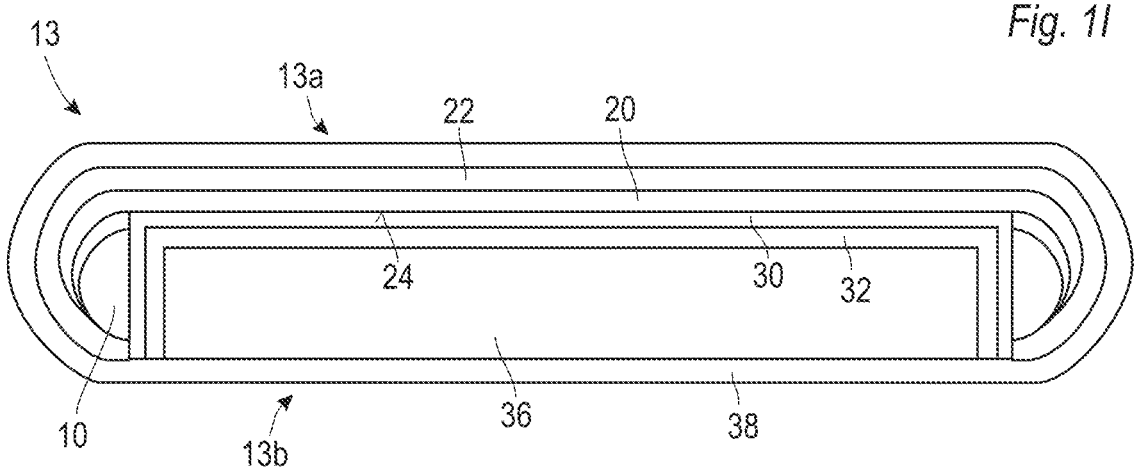

To protect the graphite core 36 against attack of oxygen and hydrogen during processes carried out during manufacturing of the semiconductor devices or circuits, a second protective layer 38 can be formed on the entire surface of the composite wafer 13 or only on the exposed surface portions of graphite core 36. Second protective layer 38 shall act as oxygen and hydrogen diffusion barrier to prevent that the carbon reacts, for example, to $CO_2$ in an oxygen-containing atmosphere or to volatile hydrocarbons at high temperatures. Suitable diffusion barrier materials are, for example, silicon, silicon nitride, silicon dioxide, silicon carbide and polysilicon. Rim structure 15 also forms a barrier. Second protective layer 38 and rim structure 15 form together a protective structure encapsulating graphite core 36. FIG. 1I illustrates the composite wafer 13 with a second protective layer 38 covering the complete surface of the composite wafer 13.

Figure 1J:
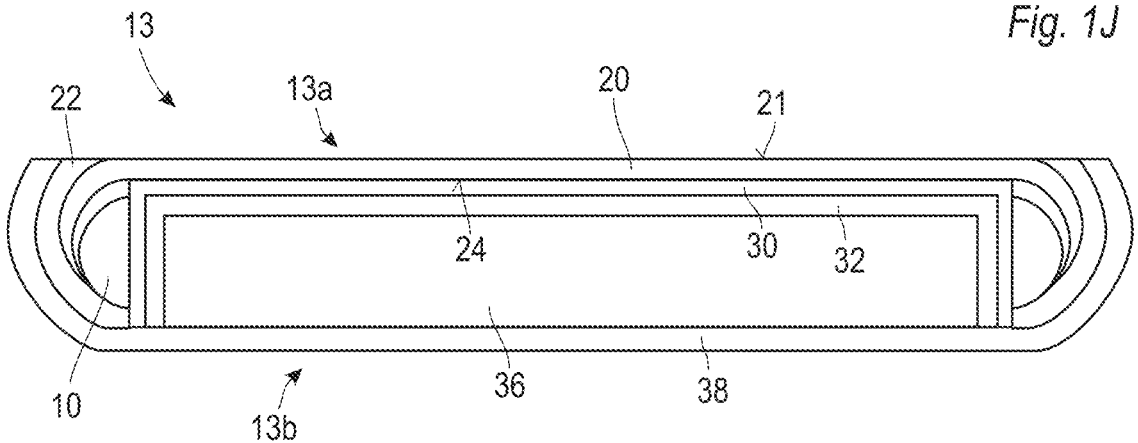

In a further process, as illustrated in FIG. 1J, first protective layer 22 and second protective layer 38 are removed at the first side 13a of composite wafer 13 to expose semiconductor layer 20. Removal can include, without being limited thereto, plasma-etching, wet-chemical etching and chemical-mechanical etching. The resulting composite wafer 13 is ready to be used as wafer for integrating semiconductor devices or circuits.

After integrating device structures into the first side 13a of the composite wafer 13, i.e. into semiconductor layer 20, the graphite core 36 can be removed or can be left to be included into the final device. For example, if a device structure similar to a SOI-structure such as CMOS-SOI is desired, graphite core 36 remains in place and is not removed. In this case, graphite core 36 forms the carrier structure of the final device.

If the back-side 24 of the semiconductor layer 20 (device layer) needs to be processed, for example for vertical power devices having a back-side metallization, graphite core 36 can be removed by grinding, etching, burning in an oxygen-containing atmosphere or any suitable combination thereof. Optional intermediate layer 31 can also be removed, for example by a wet-chemical etching process, leading to exposure of the back-side of the semiconductor layer 20. In further processes, any desired process to finalize the semiconductor devices or circuits can be performed including implantation and formation of back-side metallization.

Optional intermediate layer 31 can be omitted when devices are desired with a vertical current flow, i.e. the current flows from the front-side to the back-side of the device. Composite wafer 13 includes than a graphite core 36 which is in electrical contact with semiconductor layer 20. Alternatively, only a conductive intermediate layer can be formed. The material characteristics of graphite can be selected to have an electrical conductivity sufficient to serve as back-side electrode or contact layer. This also facilitates handling of the final devices since the total substrate thickness of the devices is increased.

According to an embodiment, the composite wafer 13 having the graphite carrier or core 36 and the monocrystalline semiconductor substrate or layer 20 attached to the graphite carrier or core 36 is used for processing or integrating a plurality of semiconductor devices into the monocrystalline semiconductor substrate or layer 20. After partial or complete integration, the graphite core 36 is removed from the processed monocrystalline semiconductor layer, for example in an oxygen containing plasma. In a further process, the monocrystalline semiconductor substrate or layer 20 is diced, for example by sawing or scribing, to form a plurality of separated semiconductor devices.

According to an embodiment, as described herein, a graphite carrier is used and constitutes a cost efficient alternative to a common SOI substrate which requires an expensive monocrystalline semiconductor material. The graphite material can be adjusted with respect to its coefficient of thermal expansion to be similar to that of the semiconductor material to reduce warping of the composite wafer.

Figure 2A:
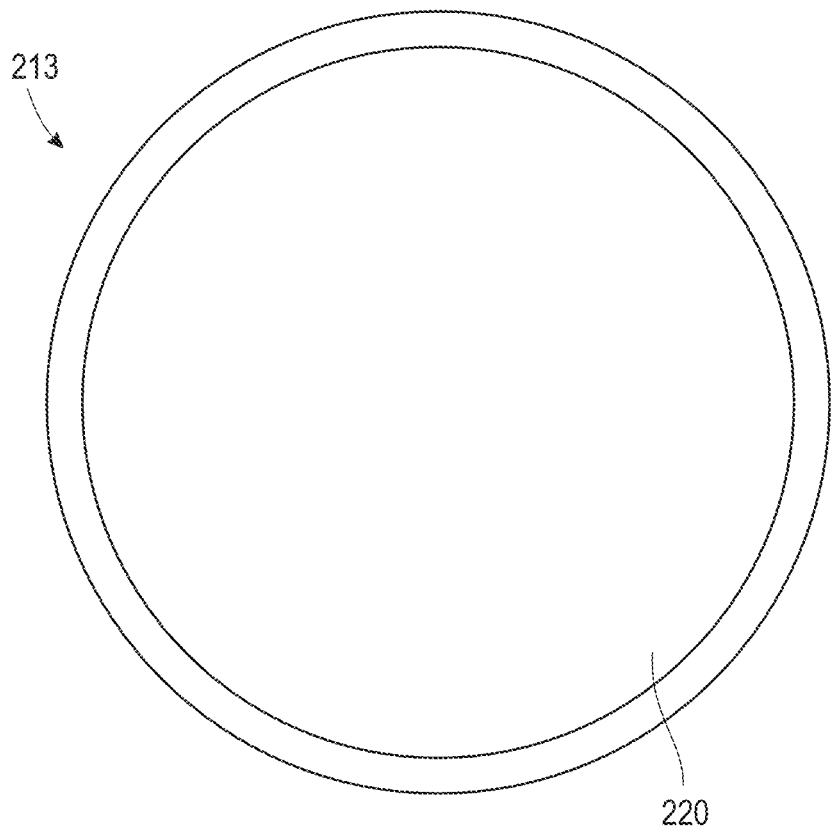
FIGS. 2A to 2B illustrate processes of a method for manufacturing a composite wafer according to an embodiment.
Figure 2B:
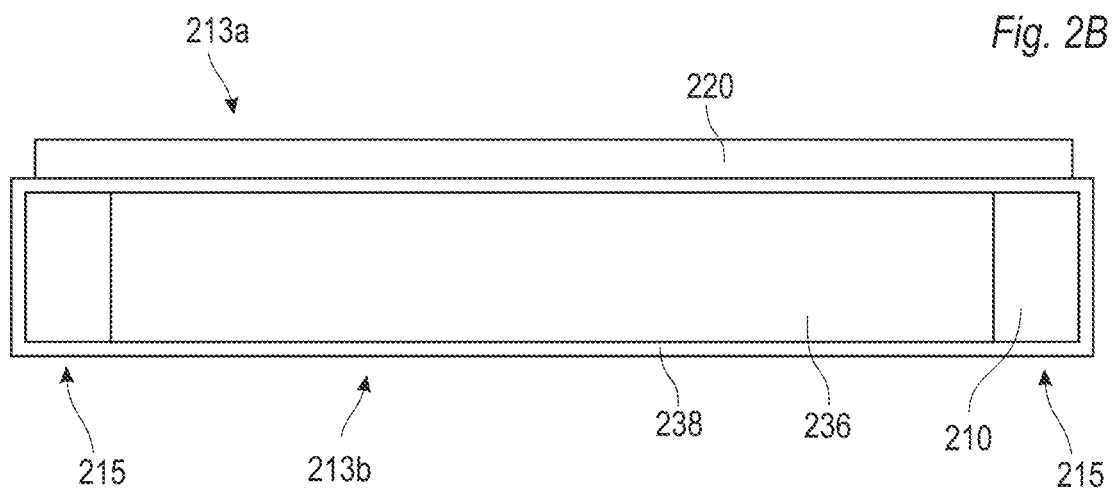

FIGS. 2A and 2B illustrate a further embodiment with a reduced usage of monocrystalline material. A composite wafer 213 is formed on the basis of a polycrystalline semiconductor wafer such as a polysilicon wafer 210. FIG. 2A illustrates a plan view on the composite wafer 213 while FIG. 2B illustrates a cross sectional view of composite wafer 213.

Similar as described above, a recess is formed in the polycrystalline wafer 210 at the second side 213b, filled with a moulding composition by any one of the processes described above, and then subjected to an annealing process or processes to form a graphite core 236. In a further process, a protective layer 238 is formed on the entire surface of the composite wafer 213. For example, $Si_3N_4$ can be used as material for protective layer 238. Composite wafer 213 includes, as above, a rim structure 215 which laterally protects the graphite core 236. Rim structure 215 is composed of polycrystalline material. Protective layer 238 and rim structure 215 form a protective structure encapsulating graphite core 236.

On the first side 213a of the composite wafer 213 there is disposed a monocrystalline semiconductor layer 220 forming the device layer in this embodiment. Semiconductor layer 220 can be attached to the graphite core 236 by bonding for example. It would also be possible to bond the polycrystalline wafer 210 to the semiconductor layer 220 and form the recess subsequently thereto. Hence, the carrier substrate formed by graphite core 236, rim structure 215 and protective layer 238 can be formed in advance and then bonded to the semiconductor layer 220 or, alternatively, the carrier substrate can be formed after bonding the polycrystalline wafer 210 to the semiconductor layer 220.

The final composite wafer 213 includes a carrier substrate or wafer and a device layer attached thereto. The carrier substrate is formed at least by graphite core 236 and polycrystalline rim structure 215 while the device layer is formed by monocrystalline semiconductor layer 220. The carrier substrate can also include further layers such as a buried insulating layer and at least one protective layer 238 covering at least the second side 213b of the graphite core 236 for protecting the graphite core 236.

Figure 3:
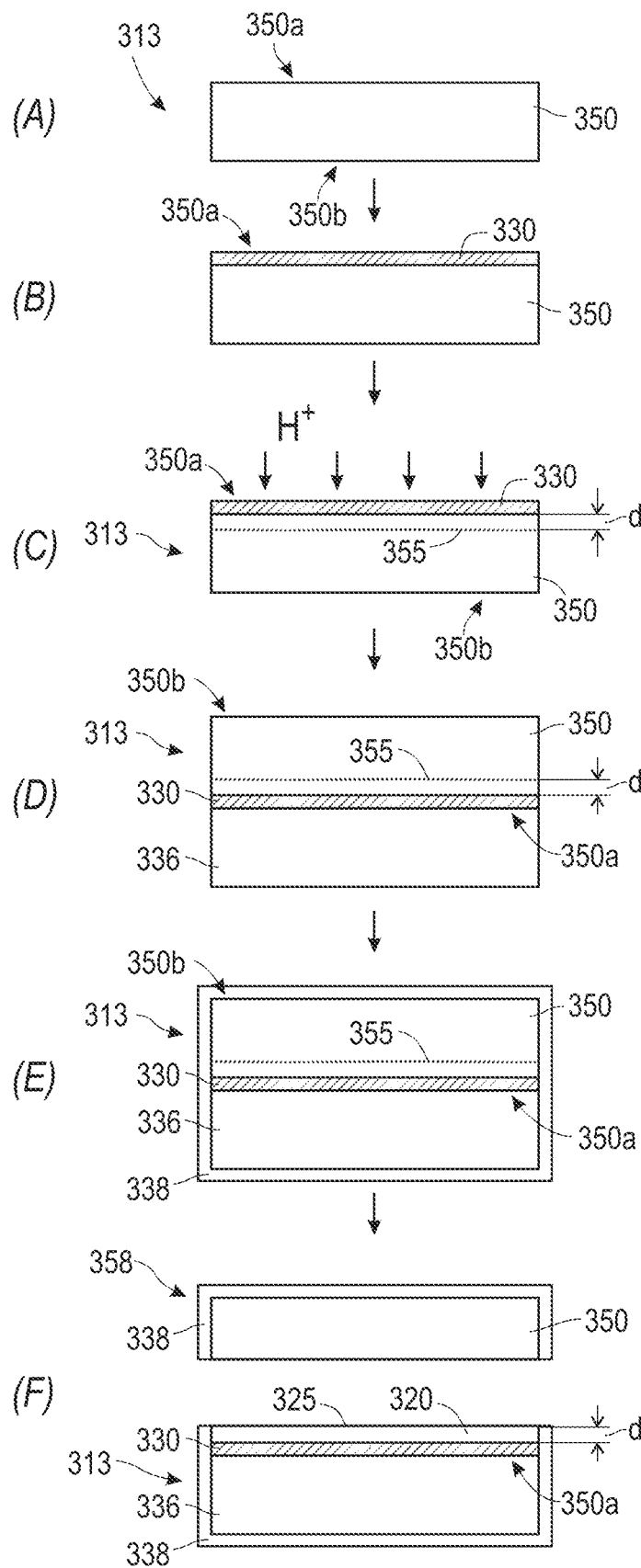
FIG. 3 illustrates processes of a method for manufacturing a composite wafer according to an embodiment.
Figure 4:
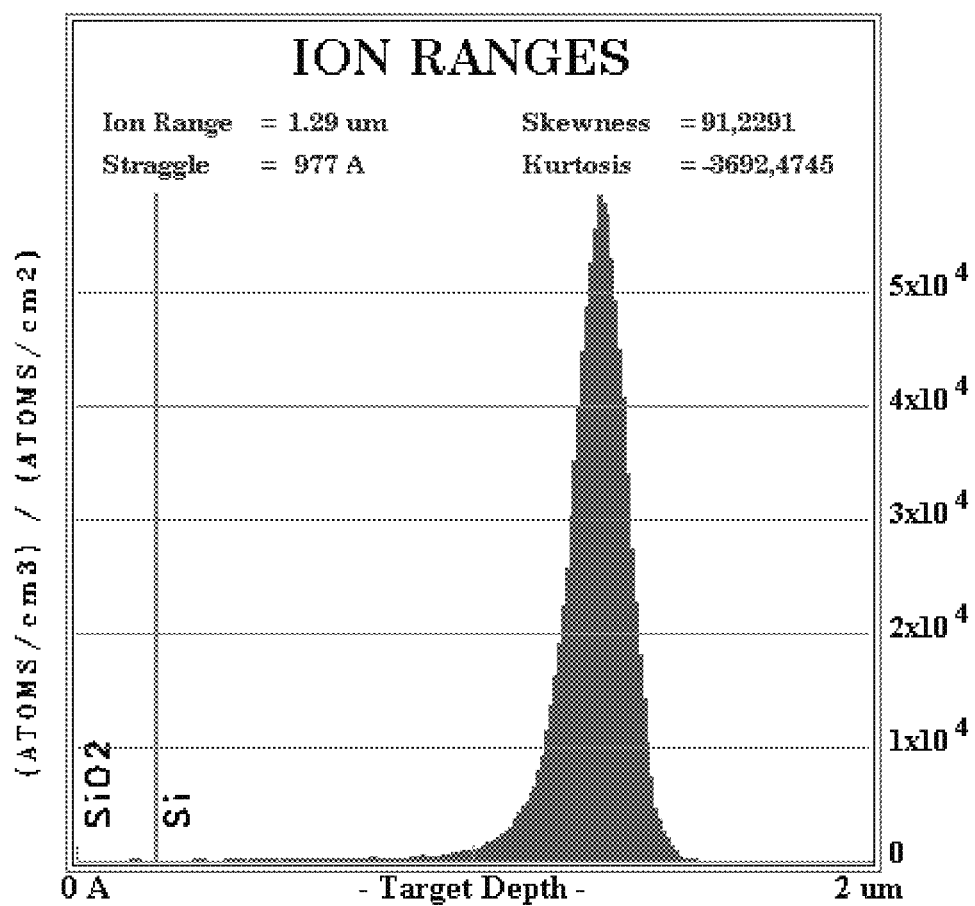
FIG. 4 illustrates an implantation profile of protons used during manufacturing of a composite wafer according to an embodiment.

With respect to FIGS. 3 and 4, a further embodiment of manufacturing a composite wafer 313 is described which can be combined with any of the other embodiments disclosed herein. In process (A), a monocrystalline semiconductor wafer 350 is provided having a first side 350a and a second side 350b arranged opposite to the first sides 350a. Semiconductor wafer 350 can be of any suitable semiconductor material as described above. For many applications, silicon or silicon carbide is used. In process (B), a bonding layer 330, which later forms an intermediate layer or buried layer, is formed on the first side 350a of semiconductor wafer 350. Bonding layer 330 can be, for example, an insulating layer such as an oxide layer. For example, thermal oxidation can be used to form bonding layer 330. Furthermore, bonding layer 330 can also be deposited. Bonding layer 330 serves in subsequent processes as a layer facilitating bonding to a carrier substrate or wafer. The material of bonding layer 330 is therefore selected to provide a thermally stable layer. An example for an insulating bonding layer is silicon dioxide. An example for an electrically conductive bonding layer is polysilicon. If an insulating layer is not required the bonding layer is not absolutely necessary.

In a further process as illustrated in (C), gas ions such as protons are implanted into the first side 350a of semiconductor wafer 350 into a given depth. The implantation depth can be adjusted by selecting the implantation energy. The implantation depth defines the thickness d of the device layer as described further below.

The implantation of gas atoms or gas ions (e.g. protons), respectively, causes the formation of a delamination layer 355 which can be a micro-bubble layer or micro-porous layer along which the semiconductor wafer 350 is delaminated by a later process.

As illustrated in process (D), a graphite carrier or core 336 is formed on the first side 350a of semiconductor wafer 350. Semiconductor wafer 350 is turned in (D) upside-down so that the first side 350a is now the bottom side while the second side 350b is now the top side. Graphite carrier 336 can be formed as described above including bringing a moulding composition onto the first side 350a of semiconductor wafer 350. A mild annealing step can be performed to remove optional binders or any other auxiliary compounds.

In a further process as illustrated in (E), a protective layer 338 is formed at least on exposed portions of graphite core 336. Protective layer 338 can also be formed on the entire surface of composite wafer 313 including on the second side 350b of semiconductor wafer 350. Protective layer 338 can be a single layer or a layer stack. Suitable materials for forming protective layer 338 are polysilicon, silicon nitride ($Si_3N_4$) or silicon dioxide ($SiO_2$). Protective layer 338 can be formed at comparably low temperatures to avoid thermal stress within delamination layer 355. Protective layer 338 protects the graphite core 336 and bonding layer 330 against mechanical and chemical stress which may occurs during subsequent processes including processes used for integrating semiconductor devices and circuits.

The thickness and material for protective layer 338 can be selected according to specific needs. For example, protective layer 338 should be configured to serve as oxygen and hydrogen diffusion barrier as described above.

As illustrated in (F), composite wafer 313 is subjected to a thermal treatment to delaminate the semiconductor wafer 350 along the delamination layer 355 which serves as a cleavage plane. The thermal treatment causes mechanical tensions which results in a separation along the delamination layer 355. A comparably thin semiconductor layer 320 remains bonded to the graphite core 336 through bonding layer 330. Semiconductor layer 320 has a thickness d which was defined by the implantation energy of the gas ions in process (C).

The delamination process leads to the formation of a part-wafer 358 which can be used again for manufacturing further composite wafers. This is very cost-efficient and is particularly of interest for SiC. Part-wafer 358 can be polished before reuse.

Composite wafer 313 includes the monocrystalline semiconductor layer 320 which remains attached to graphite core 336. Semiconductor layer 320, which was detached from semiconductor wafer 350 by the delamination process, includes a cleavage surface 325 which can be polished if desired.

According to an embodiment, an epitaxial layer (not shown) can be formed on the semiconductor layer 320 to tailor, for example, the doping concentration of the device layer. Epitaxial layer and semiconductor layer 320 form then together the device layer.

According to an embodiment, bonding layer 330 can be omitted or replaced by an electrically conductive layer such as a polysilicon layer to allow formation of devices having a vertical current path from the top side to the bottom side of the final devices.

According to an embodiment, instead of forming a delamination layer 355 for cutting the semiconductor wafer 350, semiconductor wafer 350 can be grinded, polished and/or etched to reduce its thickness and to form a semiconductor layer 320 having the desired thickness d.

As described above, a method for manufacturing a composite wafer is provided according to an embodiment. The method includes providing a monocrystalline semiconductor substrate including a first side and a second side arranged opposite to the first side; forming an insulating layer on the first side of the monocrystalline semiconductor substrate; depositing a moulding composition containing at least one of carbon powder, pitch, aromatic hydrocarbons, a binder, and a combination thereof on the insulating layer; and annealing the deposited moulding composition to form a graphite carrier attached to the semiconductor substrate.

According to an embodiment, gas ions are implanted into the first side of the monocrystalline semiconductor substrate to form a delamination layer such as a micro-bubble layer in a predefined depth after forming the insulating layer. The monocrystalline semiconductor is subjected to a heat treatment for cutting or splitting the monocrystalline semiconductor substrate along the delamination layer.

According to an embodiment, the splitting of the monocrystalline semiconductor wafer results in the formation of a monocrystalline semiconductor layer which remains attached to the graphite carrier, the monocrystalline semiconductor layer includes an exposed side. A further process includes forming an epitaxial semiconductor layer on the exposed side of the monocrystalline semiconductor layer.

According to an embodiment, the thickness of the monocrystalline semiconductor wafer can be reduced by removing semiconductor material at the first side of the monocrystalline semiconductor wafer to form a thin semiconductor layer serving as device layer.

According to an embodiment, the total thickness of bonding layer 330 and the desired thickness d of the semiconductor layer 320 should be about 1.3 µm or less to reduce the implantation energy needed for implanting the gas ions, particularly when using protons. When restricting the total thickness to this range, proton implantation energy can be 150 keV or less. At this not very high implantation energy, the generation of strong X-ray radiation is comparably low which is beneficial for the equipment. When restricting the implantation energy to about 150 keV or less, no additional safety equipment is needed. Furthermore, restricting the implantation energy also reduces the energy impact into the semiconductor material and thus allows an increase of the implantation dose, i.e. beam current, to reduce the implantation duration. It is, however, also possible to use higher implantation energies if desired.

According to an embodiment, the total implantation depth with respect to the upper surface of the bonding layer 330, corresponds to the thickness of the bonding layer plus additional few tens nanometer or several tenths of micrometer for the comparably thin semiconductor layer 320. The bonding layer 330 can be, for example about 50 nm to about 500 nm thick. The thickness d of the semiconductor layer 320 can be in a range from about 10 nm to about 200 µm. The semiconductor layer 320 can be comparably thin and even thinner than the desired final thickness for the device layer since an epitaxial layer can be formed subsequently to the splitting on the semiconductor layer 320 to reach the final thickness.

According to an embodiment, the gas ions are implanted into the first side 350a of the monocrystalline semiconductor wafer 350 using implantation energy of no more than 150 keV.

FIG. 4 shows an exemplary doping profile for protons implanted with energy of 150 keV perpendicular to the surface of a 200 nm thick $SiO_2$ disposed on the surface of a silicon wafer 350. Such an implantation results in the formation of a delamination layer in a depth of about 1.29 µm when measured from the top surface of the $SiO_2$ layer. At this depth, delamination occurs during the thermal treatment. By appropriately selecting the implantation energy, the location of the delamination layer 355 and hence the target thickness of the semiconductor layer 320 can be adjusted.

The delamination process as described herein is also attractive for power devices on the basis of SiC. Examples are diodes, J-FETs, IGBTs, MOSFETs, SiC-SOI devices etc. The process starts with providing a SiC wafer 350 and formation of an optional bonding layer which can be insulating or electrically conducting. After delamination, the SiC wafer 350 can be reused several times, wherein each time the wafer has been used its thickness is reduced by the amount corresponding to the thickness of semiconductor layer 320 which remains attached to the carrier substrate or wafer. After delamination, the surface of the SiC wafer 350 can be polished before reuse.

In case of SiC, protons are typically used for generating delamination layer 355. Alternatively, a combination of dopants can be used, for example protons and boron ions. The latter approach allows reduction of the needed implantation dose.

The carrier wafer having a graphite core can be formed by any of the above described methods such as injection moulding or compression moulding directly on the SiC wafer 350, or can be manufactured in advance and then bonded to the SiC wafer as described further below. It is also possible to provide a crystalline graphite carrier substrate which is then bonded to the SiC wafer 350.

According to an embodiment, the surface of the SiC wafer 350 to which the graphite core is bonded or onto which the graphite is moulded, can be transformed into a carbon layer by a suitable thermal process. By so doing, the contact to the graphite material can be improved since the graphite material, either by moulding or bonding, is brought into direct contact with the carbon layer. This approach is particularly suitable for devices with a vertical current path since no buried insulating layer is formed.

According to an embodiment, it is furthermore possible to use a crystalline graphite carrier which is bonded to a semiconductor wafer which either undergoes the above described delamination procedures or back etching to form a thin semiconductor layer attached to the crystalline graphite carrier. Crystalline graphite has a particular lattice structure which exhibits an anisotropic heat conductivity which can be used to improve heat dissipation particularly in lateral direction. This reduces the likelihood of hot-spot generation within the final devices or reduces the maximum temperature of such hot-spots. Crystalline graphite is also comparably inexpensive.

Figure 5:
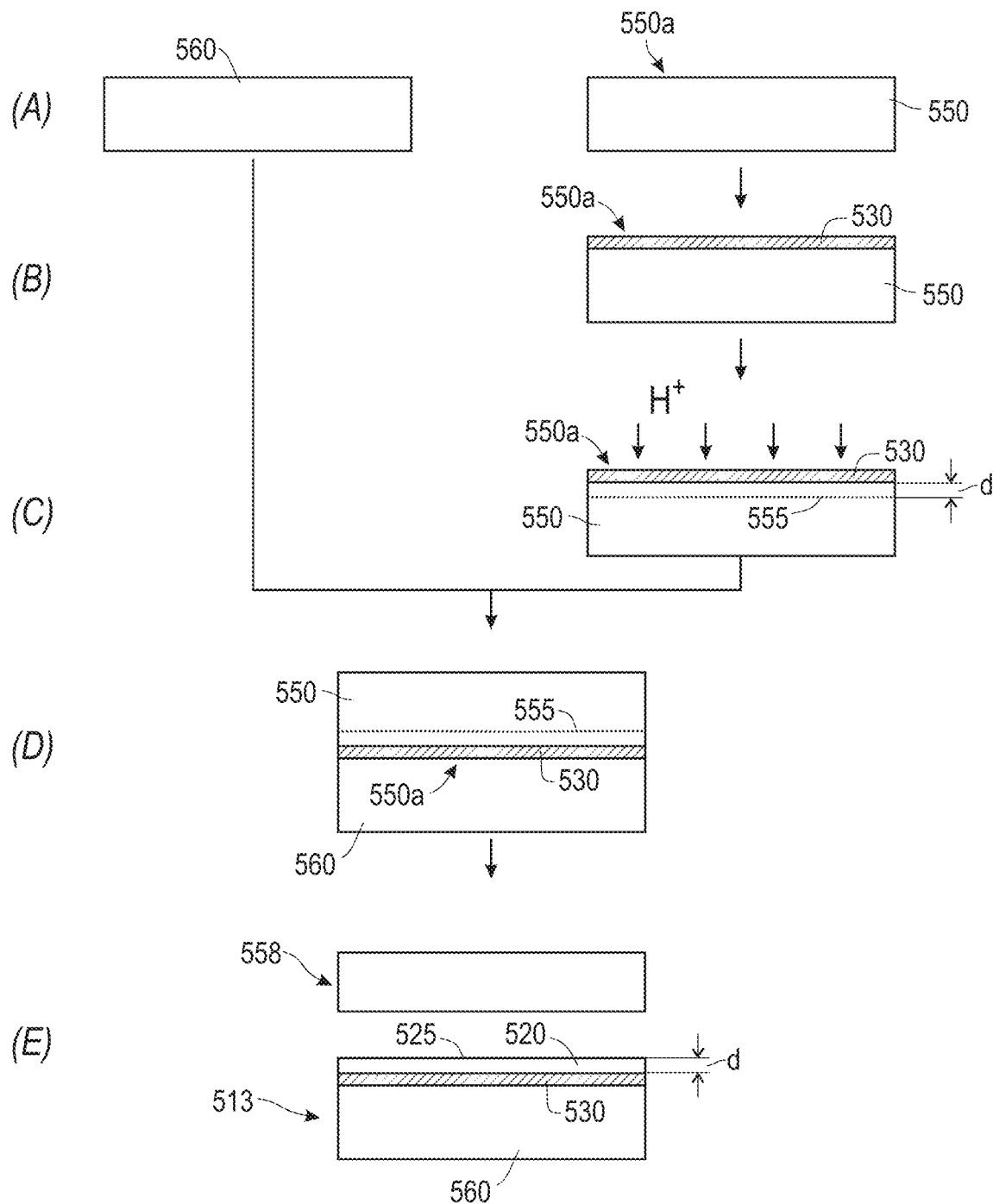
FIG. 5 illustrates processes of a method for manufacturing a composite wafer according to an embodiment.

With respect to FIG. 5 a further embodiment is described. In process (A), a semiconductor wafer 550 is provided, which can be any suitable semiconductor material, particularly Si and SiC. As described in connection with FIG. 3, a bonding layer 530 is formed on the first side 550a of the semiconductor wafer 550 in process (B) and then gas ions such as protons are implanted into the first side 550a to form a delamination layer 555 at a predefined depth d in process (C).

A carrier wafer 560 is provided which includes at least a graphite core of turbostratic or amorphous graphite or which can be a crystalline graphite wafer. Carrier wafer 560 can include an optional protective layer which is not illustrated in FIG. 5. Carrier wafer 560 can be manufactured by any suitable process as described herein.

Carrier wafer 560 is then bonded to the semiconductor wafer 550 through bonding layer 530 in process (D) which shows semiconductor wafer 550 turned up-side down in contact with carrier wafer 560. A protective layer (not shown) can be formed on the entire exposed surface of the bonded wafers or only on carrier wafer 560 if desired.

By means of a thermal treatment as illustrated in process (E), semiconductor wafer 550 is delaminated from the carrier wafer 560 along delamination layer 555 so that a semiconductor layer 520 having a thickness d remains attached to carrier wafer 560. This process produces a composite wafer 513 and part-wafer 558 which can be reused as described above. Semiconductor layer 520 includes a cleavage surface 525 along which the delamination or separation occurs and which can be polished or etch to form a flat and defect-free surface. A further semiconductor layer can be epitaxially deposited on semiconductor layer 520 to increase the total thickness of the crystalline semiconductor material disposed on carrier wafer 360.

According to an embodiment, a method for manufacturing a composite wafer is provided. The method includes providing a monocrystalline semiconductor wafer having a first side and a second side arranged opposite to the first side; implanting gas ions into the first side of the monocrystalline semiconductor wafer to form a delamination layer in a predefined depth; providing a carrier wafer having a graphite core and a protective structure encapsulating the graphite core; bonding the carrier wafer to the first side of the monocrystalline semiconductor wafer substrate; and subjecting the monocrystalline semiconductor wafer and the carrier wafer to a heat treatment for splitting the monocrystalline semiconductor wafer along the delamination layer.

The temperature stability of the composite wafer as described herein is not impaired compared to the temperature stability of pure silicon wafers due to the thermal stability of graphite. Furthermore, graphite exhibits similar mechanical properties as silicon and silicon carbide and therefore does not interfere with these materials. Graphite is also sufficiently mechanically stable to be suitable as carrier material. Moreover, graphite is chemically inert against most or nearly all chemicals typically used in the semiconductor processing technology. Furthermore, graphite can be mechanically processed such as grinded, for example to form thin devices. Moreover, graphite can also be deposited by CVD. Since graphite can be formed in an appropriate manner before the processing of the actual semiconductor devices or circuits starts, the graphite deposition, bonding or formation do not interfere with the device processing. It is, however also possible to form the graphite carrier or core or to bond the graphite carrier at a later stage.

Using a graphite carrier or core as described herein also allows thinning of the device layer (semiconductor layer 20, 320, 520 with or without additional epitaxial layer) before device processing starts. This also reduces the costs since the critical process of thinning the device layer is shifted to stages before the actual device processing starts. It is further possible to start with an already thinned semiconductor wafer substrate with subsequent formation of the graphite carrier on that wafer. Formation of the graphite carrier as described herein is mechanically less critical than, for example, bonding. Alternatively, the thinned semiconductor wafer substrate can be brought into contact with a separately formed graphite carrier. For both options, the thermal and chemical stability of graphite, particularly when covered by a protective layer, is helpful. This furthermore reduces the production costs.

As described herein, a device layer can be formed and its target thickness well defined. This can be done by using a suitable etching stop layer and epitaxial deposition of a semiconductor layer on semiconductor wafer used as intermediate substrate to build up the composite wafer as described herein.

Graphite can be protected against chemical attack of oxygen and hydrogen at high temperatures by forming a protective layer preventing oxygen or hydrogen diffusion. Suitable barrier materials include crystalline silicon, polysilicon, amorphous silicon and silicon nitride to name few. On the other hand, graphite can be removed, if desired, by oxygen or hydrogen in plasma without any residues. The removal is very selective with respect to other materials used in semiconductor processing. Different to other carrier systems, no residues such as glue residues or foil residues remain on the device.

By using a graphite carrier or core, a significant cost reduction in comparison to common SOI wafers can be achieved. Furthermore, when using an insulating intermediate layer between the semiconductor layer and the graphite core, devices with a SOI-structure can be manufactured. The size of such devices can be reduced without requiring pn-junctions for vertical insulation since the insulating intermediate layer forming a buried insulating layer serves as vertical insulation. The material for the insulating intermediate layer can be selected according to specific needs. Intermediate layer can be a single layer or a layer stack.

It is to be understood that the features of the various exemplary embodiments described herein may be combined with each other, unless specifically noted otherwise.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a composite wafer, comprising:
 providing a carrier wafer comprising a graphite core and a protective structure encapsulating the graphite core; and
 bonding a monocrystalline semiconductor wafer to the carrier wafer.

2. A method according to claim 1, wherein providing a carrier wafer comprises:
 providing a polycrystalline semiconductor wafer;
 forming a recess in the polycrystalline semiconductor wafer;
 depositing a moulding composition comprising at least one of carbon powder and pitch in the recess of the polycrystalline semiconductor wafer; and
 annealing the deposited moulding composition to form the graphite core.

3. A method according to claim 1, further comprising:
 forming a protective layer on the graphite core.

* * * * *